United States Patent
Kim (10) Patent No.: US 10,211,422 B2
(45) Date of Patent: Feb. 19, 2019

(54) TRANSPARENT DISPLAY PANEL AND TRANSPARENT DISPLAY DEVICE INCLUDING THE SAME

(71) Applicant: SAMSUNG DISPLAY CO., LTD., Yongin-si, Gyeonggi-do (KR)

(72) Inventor: Jongyun Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/698,810

(22) Filed: Sep. 8, 2017

(65) Prior Publication Data
US 2018/0076411 A1 Mar. 15, 2018

(30) Foreign Application Priority Data
Sep. 12, 2016 (KR) .................. 10-2016-0117471

(51) Int. Cl.
*H01L 51/52* (2006.01)
*H01L 27/32* (2006.01)

(52) U.S. Cl.
CPC ........ *H01L 51/5237* (2013.01); *H01L 27/326* (2013.01); *H01L 27/3258* (2013.01); *H01L 27/3276* (2013.01); *H01L 2227/323* (2013.01)

(58) Field of Classification Search
CPC .............. H01L 51/5237; H01L 27/326; H01L 27/3258; H01L 2227/323; H01L 27/3276
See application file for complete search history.

(56) References Cited

U.S. PATENT DOCUMENTS

| | | | |
|---|---|---|---|
| 8,193,700 B2 | 6/2012 | You | |
| 9,452,438 B2 | 9/2016 | Yamamoto et al. | |
| 2005/0264736 A1* | 12/2005 | Tsubata | G02F 1/136227 349/122 |
| 2006/0139525 A1* | 6/2006 | Ahn | G02F 1/133345 349/114 |
| 2008/0012008 A1* | 1/2008 | Song | H01L 27/283 257/40 |
| 2012/0295508 A1* | 11/2012 | Sung | H01L 27/3211 445/35 |
| 2017/0018574 A1* | 1/2017 | Jeong | H01L 27/1237 |

FOREIGN PATENT DOCUMENTS

| | | |
|---|---|---|
| JP | 2005093642 A | 4/2005 |
| KR | 1020080054621 A | 6/2008 |
| KR | 1020090073901 A | 7/2009 |
| KR | 1020100075197 A | 7/2010 |
| KR | 1020140114332 A | 9/2014 |

* cited by examiner

*Primary Examiner* — Su C Kim
(74) *Attorney, Agent, or Firm* — Cantor Colburn LLP

(57) ABSTRACT

A transparent display device includes: a display panel displaying an image with light and including: a pixel area at which light is generated, a transmission area at which light transmits through the display panel, and a gate line area including a gate line; at the pixel area, a display element generating the light, and a driving circuit driving the display element; and an insulating layer pattern at the pixel and gate line areas. The driving circuit includes a semiconductor layer, gate, source and drain electrodes, and a gate insulating layer on the gate line and electrode, the display element includes pixel and common electrodes, and a light emitting layer, the insulating layer pattern at the pixel area is between the gate insulating layer and the common electrode, and the insulating layer pattern at the gate line area defines a groove at the transmission area.

20 Claims, 9 Drawing Sheets

TRANSPARENT DISPLAY PANEL AND TRANSPARENT DISPLAY DEVICE INCLUDING THE SAME

This application claims priority under to Korean Patent Applications No. 10-2016-0117471, filed on Sep. 12, 2016, and all the benefits accruing therefrom under 35 U.S.C. § 119, the content of which in its entirety is herein incorporated by reference.

BACKGROUND

1. Field

Exemplary embodiments of the invention relate to a transparent display device, and more particularly, to a transparent display device having improved display quality.

2. Description of the Related Art

In an information society, display devices are becoming more important as a visual information delivery medium. In order to take a major position in the future, display devices having relatively low power consumption, thinness, light weight and high image quality are desired.

Such display devices may be classified into a self-luminous type such as a cathode ray tube ("CRT") display device, an electroluminescence ("EL") display device, a light emitting diode ("LED") display device, a vacuum fluorescent display ("VFD") device, a field emission display ("FED") device and a plasma display panel ("PDP") device, and a non-self-luminous type such as a liquid crystal display ("LCD") device.

Transparency of a display device having relatively low power consumption, thinness, light weight and high image quality has been researched.

SUMMARY

Exemplary embodiments of the invention may be directed to a transparent display device capable of substantially reducing or effectively preventing spots that may occur in a transmissive portion at which light transmits through the display device.

According to an exemplary embodiment of the invention, a transparent display device includes: a display panel which displays an image with light, the display panel including: a substrate including: a pixel area at which light is generated, a transmission area at which light transmits through the display panel, and a gate line area in which a gate line is disposed; at the pixel area, a display element which generates the light at the pixel area, and a driving circuit which drives the display element to generate the light at the pixel area; and an insulating layer pattern at the pixel area and the gate line area. The driving circuit includes a semiconductor layer, a gate electrode, a source electrode, and a drain electrode, and a first gate insulating layer on the gate line and the gate electrode, the display element includes a pixel electrode, a light emitting layer and a common electrode, the insulating layer pattern at the pixel area is between the first gate insulating layer and the common electrode, and the insulating layer pattern at the gate line area defines a groove therein at the transmission area.

Portions of the insulating layer pattern may be disconnected from each other at the gate line area by the groove.

The driving circuit may further include a second gate insulating layer on the first gate insulating layer.

The insulating layer pattern may include a first insulating layer and a second insulating layer.

The first insulating layer may be between the second gate insulating layer and the second insulating layer, at the pixel area.

The second insulating layer may be between the first insulating layer and the common electrode, at the pixel area.

The transparent display device may further include a sealing member on the display panel.

The sealing member may contact the second gate insulating layer at the groove of the insulating layer pattern.

The sealing member may contact the second gate insulating layer at the transmission area.

For the display panel including the substrate, the display element, the driving element and the insulating layer pattern, a total thickness of the display panel at the transmission area may be less than a total thickness of the display panel at the pixel area.

The transmission area may have a larger total area than a total area of the pixel area, in a top plan view.

The groove may have one of a triangular shape, a quadrangular shape or a polygonal shape, in a top plan view.

The groove may be symmetric with respect to a central line of the transmission area, in a top plan view.

The foregoing is illustrative only and is not intended to be in any way limiting. In addition to the illustrative embodiments and features described above, further embodiments and features will become apparent by reference to the drawings and the following detailed description.

BRIEF DESCRIPTION OF THE DRAWINGS

A more complete appreciation of the invention will become more apparent by describing in detail exemplary embodiments thereof with reference to the accompanying drawings, in which.

DETAILED DESCRIPTION

Advantages and features of the invention and methods for achieving them will be made clear from exemplary embodiments described below in detail with reference to the accompanying drawings. The invention may, however, be embodied in many different forms and should not be construed as being limited to the exemplary embodiments set forth herein. Rather, these exemplary embodiments are provided so that this disclosure will be thorough and complete, and will fully convey the scope of the invention to those skilled in the art. The invention is merely defined by the scope of the claims. Therefore, well-known constituent elements, operations and techniques are not described in detail in the exemplary embodiments in order to prevent the invention from being obscurely interpreted. Like reference numerals refer to like elements throughout the specification.

In the drawings, certain elements or shapes may be illustrated in an enlarged manner or in a simplified manner to better illustrate the invention, and other elements present in an actual product may also be omitted. Thus, the drawings are intended to facilitate the understanding of the invention.

When a layer, area or plate is referred to as being related to another element such as being "on" another layer, area or plate, it may be directly on the other layer, area, or plate, or intervening layers, areas or plates may be present therebetween. Conversely, when a layer, area or plate is referred to as being related to another element such as being "directly on" another layer, area, or plate, intervening layers, areas or plates are absent from therebetween. Further when a layer, area or plate is referred to as being related to another element such as being "below" another layer, area or plate, it may be directly below the other layer, area or plate, or intervening layers, areas or plates may be present therebetween. Conversely, when a layer, area, or plate is referred to as being related to another element such as being "directly below" another layer, area or plate, intervening layers, areas or plates are absent from therebetween.

The spatially relative terms "below," "beneath," "under," "above," "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element may be "physically connected" to the other element, "electrically connected" to the other element with one or more intervening elements interposed therebetween and/or "fluidly connected."

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms used herein (including technical and scientific terms) have a same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, an exemplary embodiment of a display device and variations thereof according to the invention will be described in detail with reference to FIGS. 1A, 1B, 2, 3, 4, 5, 6A, 6B, 7, 8, and 9.

Figure 1A:
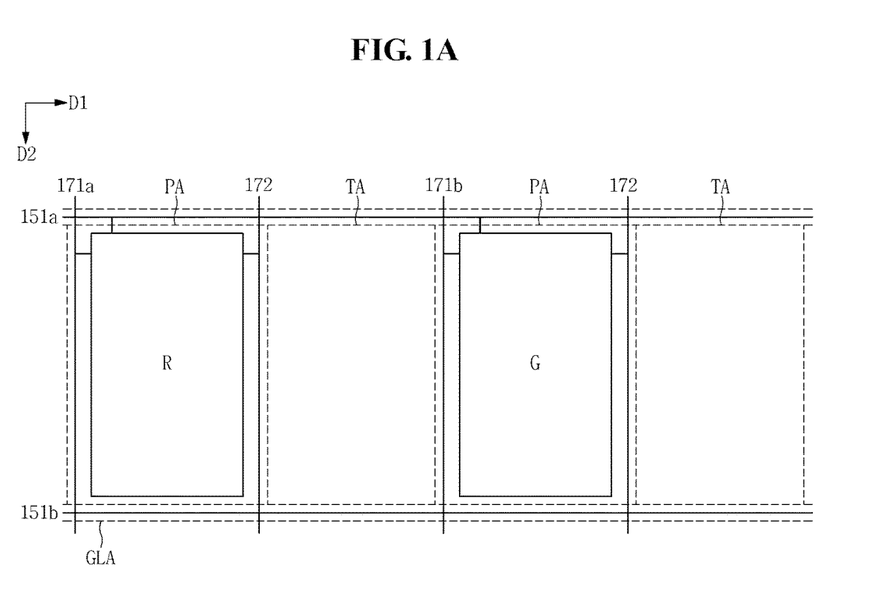
FIGS. 1A and 1B are top plan views illustrating exemplary embodiments of a portion of a transparent display panel of a transparent display device according to the invention.
Figure 1B:
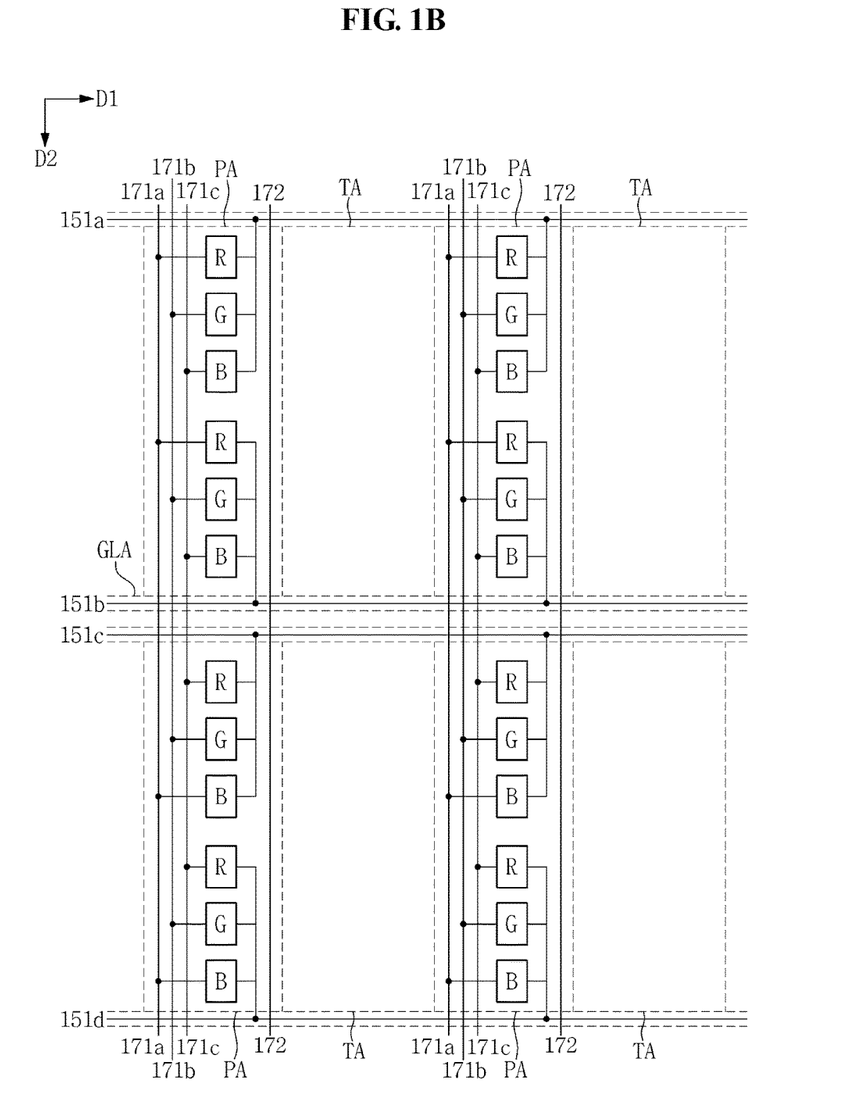
Figure 2:
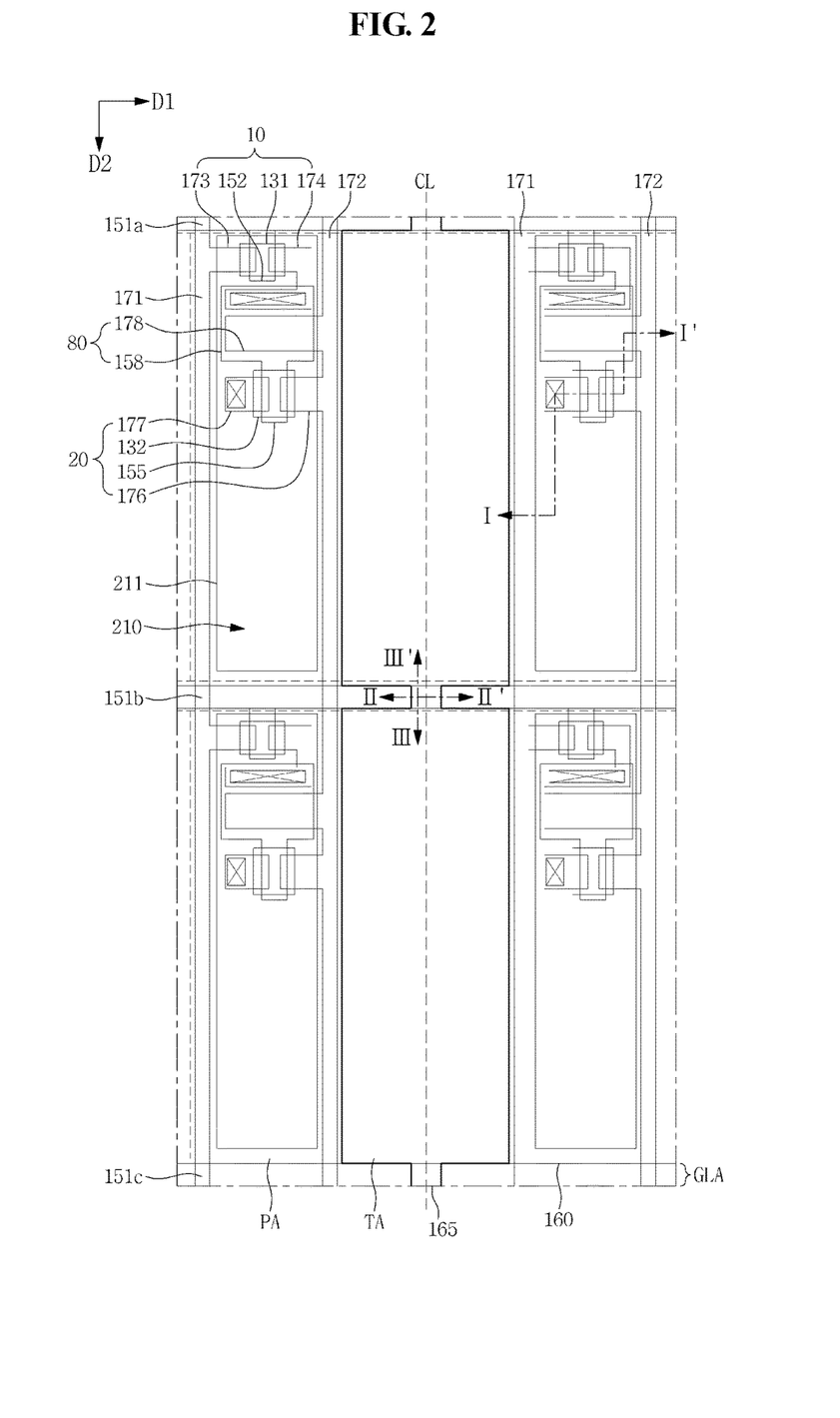
FIG. 2 is an enlarged top plan view illustrating an exemplary embodiment of a portion of a transparent display panel according to the invention.
Figure 3:
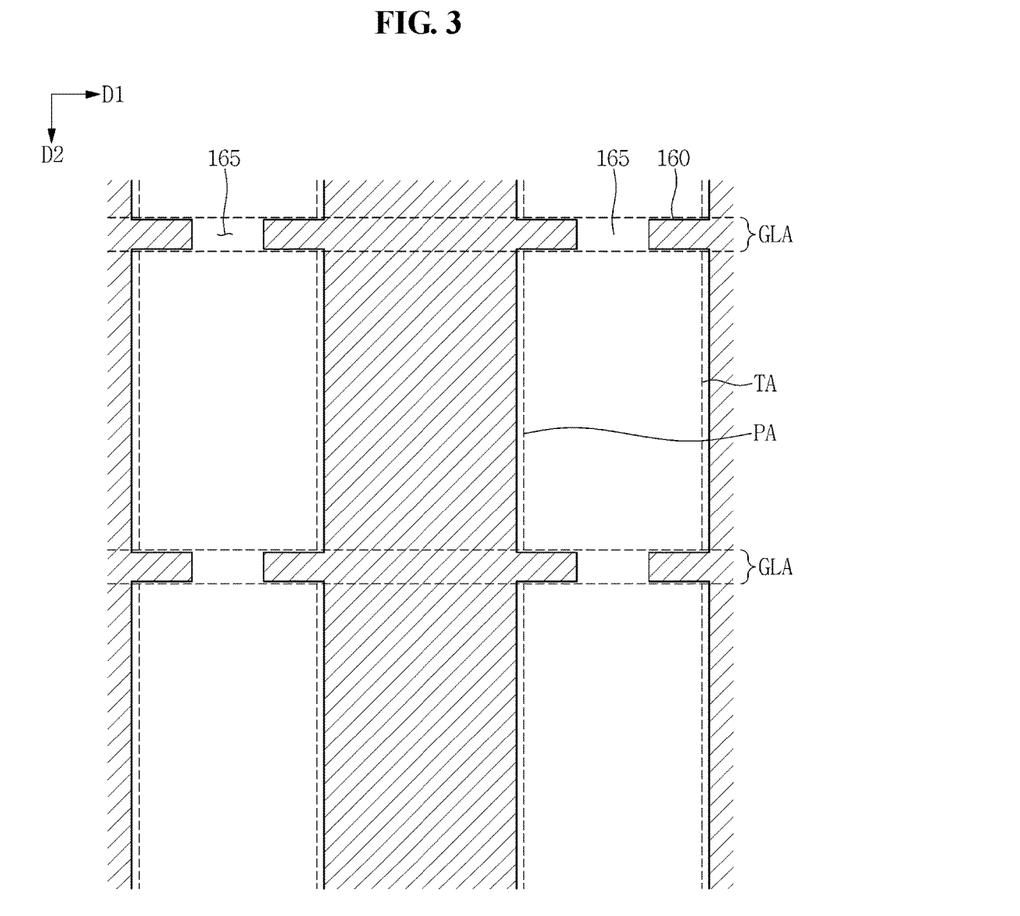
FIG. 3 is a top plan view illustrating an exemplary embodiment of a portion of an insulating layer of a transparent display panel according to the invention.
Figure 4:
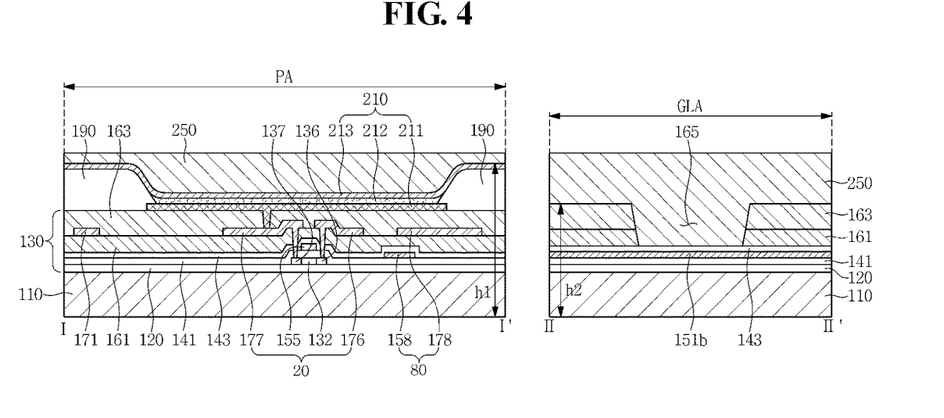
FIG. 4 illustrates cross-sectional views of the transparent display panel taken along line I-I' of FIG. 2 and taken along line II-II' of FIG. 2.

FIGS. 1A and 1B are top plan views illustrating exemplary embodiments of portions of a transparent display panel of a transparent display device according to the invention, FIG. 2 is an enlarged top view illustrating an exemplary embodiment of a portion of a transparent display panel according to the invention, FIG. 3 is a top plan view illustrating an exemplary embodiment of a portion of an insulating layer of a transparent display panel according to the invention, and FIG. 4 illustrates cross-sectional views of the transparent display panel taken along line I-I' of FIG. 2 and along line II-II' of FIG. 2.

Signal lines of the display panel illustrated in FIGS. 1A and 1B schematically show a connection relationship between elements of the display panel, however, the arrangement structure of the signal lines is not limited thereto. Signal lines of the display panel may include a gate line, a data line, a common (voltage) line, etc. One or more signal line among the signal lines of the display panel may be provided in plurality.

Referring to FIGS. 1A, 1B, 2, 3 and 4, a transparent display device includes a transparent display panel which displays an image with light. The transparent display panel includes a pixel area PA at which light is generated, a transmission area TA at which light is transmitted through the display panel, and a gate line area GLA at which the light is not generated or transmitted. The gate line area GLA may be common to each of the pixel area PA and the transmission area TA. The pixel area PA, the transmission area TA and/or the gate line area GLA may be provided in plural within the transparent display panel.

At least one pixel among pixels R, G and B is arranged at the pixel area PA. Each pixel is connected to a gate line, a data line and a common line 172. As illustrated in FIG. 1A, one pixel is disposed in one pixel area PA, to be in one-to-one correspondence with each other, and each pixel is connected to a gate line among gate lines 151a and 151b, a data line among data lines 171a and 171b, and a common line 172 among plural common lines.

Alternatively, as illustrated in FIG. 1B, six pixels are arranged in one pixel area PA. In a first pixel area row, upper three pixels R, G and B are connected to a same first gate line 151a, and the three pixels R, G, B connected to the first gate line 151a are connected to different data lines 171a, 171b, and 171c, respectively. Similarly, lower three pixels R, G and B are connected to a same second gate line 151b, and the three pixels R, G, B connected to the second gate line 151b are connected to the different data lines 171a, 171b, and 171c, respectively. In other words, among three pixels R, G, and B of a single one pixel area PA which are connected to a same gate line among the gate lines 151a, 151b, 151c and 151d, one pixel R is connected to a first data line 171a, another pixel G is connected to a second data line 171b, and the other pixel B is connected to a third data line 171c.

The gate line area GLA defines a length thereof extended in a first direction D1. The transmission area TA alternates with the pixel area PA along the first direction D1 in which the gate line area GLA lengthwise extends.

In a top plan view, the transmission area TA has a larger planar area than that of the pixel area PA. Accordingly, light transmittance of the transparent display device may be improved. In FIGS. 1A and 1B, edges or boundaries of a respective transmission area TA or pixel area PA are indicated by dotted lines.

The gate lines 151a, 151b, 151c and 151d have a length greater than a width thereof, and the length extends in the first direction D1. Such gate lines gate lines 151a, 151b, 151c and 151d are respectively disposed at a gate line area GLA among plural gate lines areas. That is, the gate line areas GLA respectively overlap the gate lines 151a, 151b, 151c, and 151d and each lengthwise extend along the first direction D1. Hereinafter, a gate line among the gate lines 151a, 151b, 151c and 151d may be generally referred to as a gate line 151. The gate line areas GLA may be respectively defined by a planar area of the gate lines 151a, 151b, 151c, and 151d in the top plan view, but the invention is not limited thereto.

Referring to FIGS. 2 and 4, the transparent display device includes a lower (display) panel and a sealing member 250. The lower panel includes a substrate 110, a driving circuit unit or layer 130 at the pixel area PA, and a display element unit or layer 210 on the driving circuit unit 130 at the pixel area PA. The display element 210 at the pixel area PA generates light used for displaying an image. Light may transmit through the layers of the lower panel at the transmission area TA thereof. In an exemplary embodiment, external light incident to the transparent display device may transmit therethrough at the transmission area TA, even through the sealing member 250 thereof. The external light may be blocked at the gate line area GLA so as to be not transmitted therethrough.

The lower panel, as illustrated in FIGS. 1A and 1B, includes at least one pixel at the pixel area PA as illustrated in FIGS. 1A and 1B, and each of the pixels R, G, and B includes the driving circuit unit 130 and the display element unit 210.

The driving circuit unit 130 includes a switching thin film transistor ("TFT") 10, a driving TFT 20 and a capacitor 80. The driving circuit unit 130 drives the display element unit 210.

Detailed structure of the driving circuit unit 130 and the display element unit 210 is illustrated in FIGS. 1A, 1B, 2, 3 and 4, but exemplary embodiments are not limited to the structure illustrated in FIGS. 1A, 1B, 2, 3 and 4. The driving circuit unit 130 and the display element unit 210 may be formed into various structures within a range that can easily be modified by those skilled in the art.

In FIG. 2, each pixel R, G and B is depicted as including two TFTs and one capacitor, but exemplary embodiments are not limited thereto. Each pixel R, G, and B may include three or more TFTs and two or more capacitors, and may have various structures including additional conductive or signal wirings.

The driving circuit unit 130 includes a data line 171 and the common line 172. Each of the data line 171 and the common line 172 has a length greater than a width thereof, and the length extends along a second direction D2 that intersects the first direction D1.

In addition, the driving circuit unit 130 includes a first gate insulating layer 141, a second gate insulating layer 143 and an insulating layer pattern 160.

In one exemplary embodiment, one single light emission area (not illustrated) may be defined by the gate line 151, the data line 171 and the common line 172 as boundaries thereof. However, the light emission area is not limited to the above definition, and the light emission area may be defined by a black matrix or a pixel defining layer 190.

The substrate 110 may be a transparent insulating substrate including a transparent material such as glass or plastic. In an exemplary embodiment, for example, the substrate 110 may include at least one selected from kapton, polyethersulphone ("PES"), polycarbonate ("PC"), polyimide ("PI"), polyethyleneterephthalate ("PET"), polyethylenenaphthalate ("PEN"), polyacrylate ("PAR") and fiber reinforced plastic ("FRP").

A buffer layer 120 may be disposed on the substrate 110. The buffer layer 120 may reduce or effectively prevent infiltration of undesirable elements to elements of the driving circuit unit 130 and provide a planarized surface. The buffer layer 120 may include suitable materials for reducing or effectively preventing infiltration and/or planarizing as described above. In an exemplary embodiment, for example, the buffer layer 120 may include at least one of the followings: a silicon nitride ($SiN_x$) layer, a silicon oxide ($SiO_2$) layer, and a silicon oxynitride ($SiO_xN_y$) layer. However, the buffer layer 120 is not invariably necessary and may be omitted based on the kinds of the substrate 110 and manufacturing process conditions thereof.

A switching semiconductor layer 131 and a driving semiconductor layer 132 are disposed on the buffer layer 120. The switching semiconductor layer 131 and the driving semiconductor layer 132 may include at least one of the following: a polycrystalline silicon layer, an amorphous silicon layer, and an oxide semiconductor such as indium galuim zinc oxide ("IGZO") and indium zinc tin oxide ("IZTO"). In an exemplary embodiment, for example, in the case where the driving semiconductor layer 132 illustrated in FIG. 2 includes a polycrystalline silicon layer, the driving semiconductor layer 132 includes or defines a channel area thereof that is not doped with impurities, and p+ doped source and drain areas thereof that are respectively formed on opposite sides of the channel area. In such an exemplary embodiment, p-type impurities, such as boron B, may be used as dopant ions and $B_2H_6$ is typically used. Such impurities may vary depending on the kinds of the TFTs.

The driving TFT 20 according to an exemplary embodiment uses a p-channel metal oxide semiconductor ("PMOS") TFT including p-type impurities, but exemplary embodiments are not limited thereto. Alternatively, the driving TFT 20 may use an n-channel metal oxide semiconductor ("NMOS") TFT or a complementary metal oxide semiconductor ("CMOS") TFT.

The first gate insulating layer 141 is disposed on the switching semiconductor layer 131 and the driving semiconductor layer 132. The first gate insulating layer 141 may include at least one of: tetraethylorthosilicate ("TEOS"), silicon nitride ($SiN_x$) and silicon oxide ($SiO_2$). In an exemplary embodiment, for example, the first gate insulating layer 141 may have a double-layer structure where a $SiN_x$ layer having a cross-sectional thickness of about 40 nanometers (nm) and a TEOS layer having a cross-sectional thickness of about 80 nm are sequentially stacked. The cross-sectional thickness is taken a direction which intersects both the first and second directions D1 and D2 described above, such as the vertical direction shown in FIG. 4.

A gate wiring collectively including gate electrodes 152 and 155 is disposed on the first gate insulating layer 141. The gate wiring further includes the gate line 151, a first capacitor plate 158 and other conductive or signal lines. In addition, the gate electrodes 152 and 155 are disposed to overlap a portion of or an entirety of the semiconductor layers 131 and 132, in particular, a channel area thereof. In an exemplary embodiment of manufacturing a transparent display device, the gate electrodes 152 and 155 serve to substantially reduce or effectively prevent the channel area from being doped with impurities when source and drain areas 136 and 137 of the semiconductor layer 132 and when source and drain areas of the semiconductor layer 131 are respectively doped with impurities during the process of forming the semiconductor layers 131 and 132.

The gate electrodes 152 and 155 and the first capacitor plate 158 are disposed in a substantially same layer of the lower panel among layers thereof on the substrate 110. As such, the gate electrodes 152 and 155 and the first capacitor plate 158 include a substantially same metal material and are formed from a same material layer in manufacturing the transparent display device. The gate electrodes 152 and 155 and the first capacitor plate 158 may include at least one of molybdenum (Mo), chromium (Cr) and tungsten (W).

The second gate insulating layer 143 is disposed on the gate wiring including the gate electrodes 152 and 155. The second gate insulating layer 143, similar to the first gate insulating layer 141, may include or be formed of silicon nitride (SiNx), silicon oxide (SiOx), tetraethoxysilane ("TEOS") or the like. However, the second gate insulating layer 143 is not invariably necessary and may be omitted.

The insulating layer pattern 160 is disposed on the second gate insulating layer 143. Referring to FIG. 3, the insulating layer pattern 160 is disposed at the pixel area PA and the gate line area GLA. The insulating layer pattern 160 may have a pattern which exposes the transmission area TA while overlapping the pixel area PA and the gate line area GLA. The insulating layer pattern 160 has or defines at least one groove 165 at the gate line area GLA. In an exemplary embodiment, for example, as illustrated in FIGS. 2, 3 and 4, the insulating layer pattern 160 may have one groove 165 at the gate line area GLA.

Portions of the insulating layer pattern 160 are disconnected from each other at the gate line area GLA by the groove 165. That is, the insulating layer pattern 160 is broken at the gate line area GLA by the groove 165 to dispose portions of the insulating layer pattern 160 at opposing sides of the groove 165 in the first direction D1. The groove 165 may expose elements of the transparent display panel at adjacent transmission areas TA, and an area of the adjacent transmission areas TA may be connected to each other. Accordingly, where adjacent transmission areas TA are fluidly connected to each other at the groove 165, the groove 165 allows a liquid such as an etchant or a cleaning solution used in the manufacturing process of the transparent display device to flow into the adjacent transmission areas TA along the second direction D2. Accordingly, display defects that may occur due to stagnation of the liquid such as an etchant and a cleaning solution may be substantially reduced or effectively prevented.

The groove 165 may be defined in a planar and/or cross-sectional shape suitable to allow a liquid to smoothly flow therethrough. In an exemplary embodiment, for example, as illustrated in FIG. 3, the groove 165 may be rectangular in shape in the top plan view. Alternatively, the grooves 165 may be polygonal in shape, e.g., a triangular shape, in the top plan view. However, exemplary embodiments are not limited thereto, and the groove 165 may be defined into various shapes to improve smooth flow of the liquid therethrough.

When a line extending along the center of one transmission area TA is defined as a central line CL of the transmission area TA, the groove 165 is symmetric with respect to the central line CL of an adjacent transmission area TA. Accordingly, the aforementioned liquid may flow uniformly.

The insulating layer 160 may include a first insulating layer 161 and a second insulating layer 163.

The first insulating layer 161 may be an insulating interlayer. The first insulating layer 161 is on the second gate insulating layer 143. In an exemplary embodiment, for example, the first insulating layer 161 is between the first gate insulating layer 141 and a common electrode 213 of the display element 210. In an exemplary embodiment, for example, as illustrated in FIG. 4, the first insulating layer 161 is between the second gate insulating layer 143 and the second insulating layer 163 to be described below. The first insulating layer 161, similar to the first gate insulating layer 141, may include silicon nitride (SiNx), silicon oxide (SiOx), tetraethoxysilane ("TEOS") or the like, but exemplary embodiments are not limited thereto.

The second insulating layer 163 may be a planarization layer. The second insulating layer 163 covers a data wiring, e.g., the data line 171, the common line 172, source electrodes 173 and 176 and drain electrodes 174 and 177, and a second capacitor plate 178, to be described below, which are patterned using a single mask in a method of manufacturing a transparent display device.

The second insulating layer 163 is on the first insulating layer 161. In an exemplary embodiment, for example, the second insulating layer 163 is between the first gate insulating layer 141 and the common electrode 213 of the display element 210. In an exemplary embodiment, for example, the second insulating layer 163 is disposed between the first insulating layer 161 and the common electrode 213.

The second insulating layer 163 substantially eliminates a step difference and planarizes a surface so as to increase luminance efficiency of a display element 210 (e.g., an organic light emitting diode) to be formed thereon. The second insulating layer 163 may include at least one of the following materials: a polyacrylate resin, an epoxy resin, a phenolic resin, a polyamide resin, a polyimide resin, an unsaturated polyester resin, a polyphenylene ether resin, a polyphenylene sulfide resin, and benzocyclobutene ("BCB").

The data wiring including the source electrodes 173 and 176 and the drain electrodes 174 and 177 is on the first insulating layer 161. The data wiring further includes the data line 171, the common line 172, the second capacitor plate 178, and other conductive or signal wirings. In addition, the source electrodes 173 and 176 and the drain electrodes 174 and 177 are respectively connected to the source areas 136 and TFT 20 source area (not shown) and the drain area 137 and TFT drain area (not shown) of the semiconductor layers 131 and 132, through a contact hole defined in the first gate insulating layer 141 and the first insulating layer 161.

As such, the switching TFT 10 includes the switching semiconductor layer 131, the switching gate electrode 152, the switching source electrode 173 and the switching drain electrode 174, and the driving TFT 20 includes the driving semiconductor layer 132, the driving gate electrode 155, the driving source electrode 176 and the driving drain electrode 177. Configurations of the TFTs 10 and 20 are not limited to the above embodiments, and thus may be modified into various structures that are known to and may be easily conceived by those skilled in the pertinent art.

The capacitor 80 includes the first capacitor plate 158 and the second capacitor plate 178, having the first insulating layer 161 interposed therebetween.

The switching TFT 10 may function as a switching element configured to select pixels to perform light emission such as to display an image. The switching gate electrode 152 is connected to the gate line 151. The switching source electrode 173 is connected to the data line 171. The switching drain electrode 174 is spaced apart from the switching source electrode 173 and is connected to the first capacitor plate 158.

The driving TFT 20 applies, to a pixel electrode 211, a driving power which allows a light emitting layer 212 of the display element unit 210 in the selected pixel to generate and emit light. The driving gate electrode 155 is connected to the first capacitor plate 158. The driving source electrode 176 and the second capacitor plate 178 each are connected to the common line 172. The driving drain electrode 177 is connected to the pixel electrode 211 of the display element unit 210 through a contact hole.

With the aforementioned structure, the switching TFT 10 is driven by a gate voltage applied to the gate line 151 and serves to transmit a data voltage applied to the data line 171 to the driving TFT 20. A voltage equivalent to a difference between a common voltage applied to the driving TFT 20 from the common line 172 and the data voltage transmitted from the switching TFT 10 is stored in the capacitor 80, and an electrical current corresponding to the voltage stored in the capacitor 80 flows to the display element unit 210 through the driving TFT 20, such that the display element unit 210 may emit light such as to display an image with the emitted light.

The pixel electrode 211 of the display element unit 210 is on the second insulating layer 163. The pixel electrode 211 is connected to the drain electrode 177 through a contact hole defined in the second insulating layer 163.

A portion of or an entirety of the pixel electrode 211 is in a light emission area. That is, the pixel electrode 211 is disposed corresponding to a light emission area defined by the pixel defining layer 190. The pixel defining layer 190 may include a resin such as a polyacrylate resin and a polyimide resin.

At the light emission area, the light emitting layer 212 is on the pixel electrode 211, and the common electrode 213 is on the pixel defining layer 190 and the light emitting layer 212.

The light emitting layer 212 includes a relatively low molecular organic material or a relatively high molecular organic material. At least one of a hole injection layer ("HIL") and a hole transporting layer ("HTL") may further be disposed between the pixel electrode 211 and the light emitting layer 212. At least one of an electron transporting layer ("ETL") and an electron injection layer ("EIL") may further be disposed between the light emitting layer 212 and the common electrode 213.

The pixel electrode 211 and/or the common electrode 213 may be formed as one of a transmissive electrode, a transflective electrode and a reflective electrode.

A transparent conductive oxide ("TCO") may be used to form a transmissive electrode. Such a TCO may include at least one selected from: indium tin oxide ("ITO"), indium zinc oxide ("IZO"), antimony tin oxide ("ATO"), aluminum zinc oxide ("AZO"), zinc oxide (ZnO), and alloys thereof.

A metal, e.g., magnesium (Mg), silver (Ag), gold (Au), calcium (Ca), lithium (Li), chromium (Cr), aluminum (Al), and copper (Cu), or an alloy thereof may be used to form a transflective electrode and a reflective electrode. In such an exemplary embodiment, whether an electrode is a transflective type or a reflective type may depend on a cross-sectional thickness of the electrode. Typically, the transflective electrode has a maximum or total thickness of about 200 nm or less, and the reflective electrode has a maximum or total thickness of about 300 nm or more. As the thickness of the transflective electrode decreases, light transmittance and resistance increase. On the contrary, as the thickness of the transflective electrode increases, light transmittance decreases.

In addition, the transflective electrode and the reflective electrode may have a multilayer structure which includes a metal layer including a metal or a metal alloy, and a TCO layer stacked on the metal layer.

The pixel R, G and B may have a dual-side light emitting structure where light is emitted in a direction toward the pixel electrode 211 and in a direction toward the common electrode 213 relative to the light emitting layer 212. In such an exemplary embodiment, both of the pixel electrode 211 and the common electrode 213 may be formed as a transmissive type or a transflective type.

The sealing member 250 is disposed on the lower panel including the driving circuit unit 130 and the display element unit 210. In an exemplary embodiment, for example, the sealing member 250 is on the common electrode 213 at the pixel area PA, on the first gate insulating film 141 at the transmission area TA, and on the first gate insulating layer 141 and the insulating layer pattern 160 at the gate line area GLA. The sealing member 250 may use the same material as that of the transparent insulating substrate 110, such as glass or plastic. Further, the sealing member 250 may have a thin film encapsulation structure in which one or more inorganic layers and one or more organic layers are alternately stacked.

Figure 5:
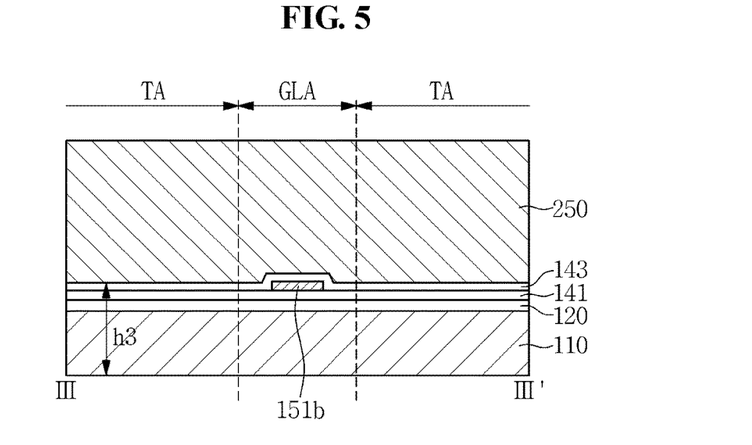
FIG. 5 is a cross-sectional view of the transparent display panel taken along line III-III' of FIG. 2.
Figure 6A:
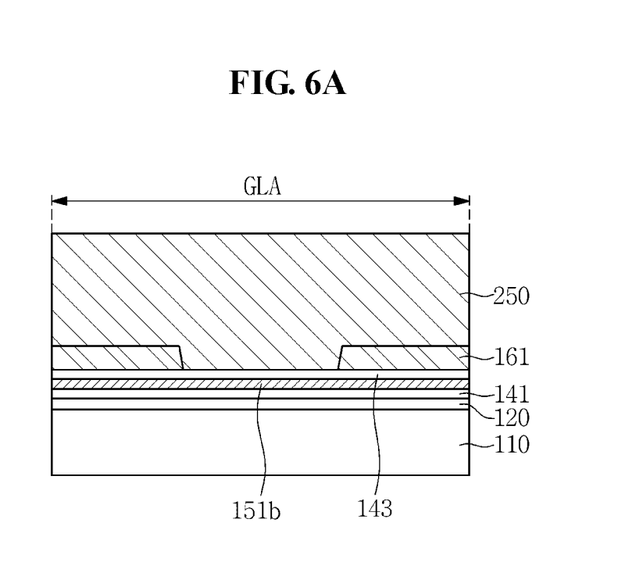
FIGS. 6A and 6B are cross-sectional views of modified exemplary embodiments of the transparent display panel taken along line II-II' of FIG. 2.
Figure 6B:
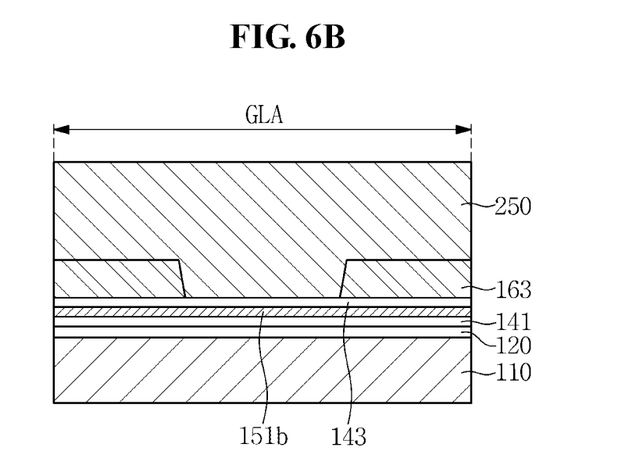

FIG. 5 is a cross-sectional view of the transparent display panel taken along line III-III' of FIG. 2, and FIGS. 6A and 6B are cross-sectional views of modified exemplary embodiments of the transparent display panel taken along line II-II' of FIG. 2.

Referring to FIGS. 4 and 5, the lower panel including the driving circuit unit 130 and the display element unit 210 described above may have a total height or thickness at the transmission area TA which is less than a total height or thickness at the pixel area PA. In an exemplary embodiment, for example, the lower panel has a first height h1 defined by a maximum total thickness of all the layers of the lower panel at the pixel area PA, a second height h2 defined by a maximum total thickness of all the layers of the lower panel at the gate line area GLA, and a third height h3 defined by a maximum total thickness of all the layers of the lower panel at the transmission area TA. A height of the lower panel at the groove 165 to be described below may be substantially the same as the height h3 of the lower panel at the transmission area TA. Accordingly, a liquid such as an etchant or a cleaning solution used in the manufacturing process of the transparent display device may smoothly flow, and display defects that may occur due to stagnation of the liquid such as an etchant and a cleaning solution may be substantially reduced or effectively prevented.

As illustrated in FIG. 5, the sealing member 250 may contact the second gate insulating layer 143 at the transmission area TA. Although not illustrated in the drawings, when the second gate insulating layer 143 is omitted, the sealing member 250 may contact the first gate insulating layer 141 and the gate line 151b at the transmitting area TA.

The insulating layer pattern 160 is on the gate line 151b at the gate line area GLA. The insulating layer pattern 160, as described above, may include the first insulating layer 161 and the second insulating layer 163. In an exemplary embodiment, for example, at the gate line area GLA, the first insulating layer 161 is on the first gate insulating layer 141, and the second insulating layer 163 is on the first insulating layer 161. As illustrated in FIG. 4, at the gate line area GLA, the first insulating layer 161 is between the second gate insulating layer 143 and the second insulating layer 163, and an upper surface of the second insulating layer 163 and a side surface of the first insulating layer 161 contacts the sealing member 250.

In alternative exemplary embodiments, the insulating layer pattern 160 may only include one of the first insulating layer 161 and the second insulating layer 163. As illustrated in FIGS. 6A and 6B, the insulating layer pattern 160 may include only the first insulating layer 161 (FIG. 6A) or may include only the second insulating layer 163 (FIG. 6B). In the case where the insulating layer pattern 160 includes only the first insulating layer 161, at the gate line area GLA, the first insulating layer 161 may be on the second gate insulating layer 143 and may contact the sealing member 250. In the case where the insulating layer pattern 160 includes only the second insulating layer 163, at the gate line area GLA, the second insulating layer 163 may be on the second gate insulating layer 143 and may contact the sealing member 250.

The sealing member 250 may contact the second gate insulating layer 143 at the groove 165. Although not illustrated in the drawings, in the case where the second gate insulating layer 143 is omitted, the sealing member 250 may contact the first gate insulating layer 141 and the gate line 151b at the groove 165.

Hereinafter, a transparent display device according to an alternative exemplary embodiment will be described in detail with reference to FIGS. 7, 8 and 9.

Figure 7:
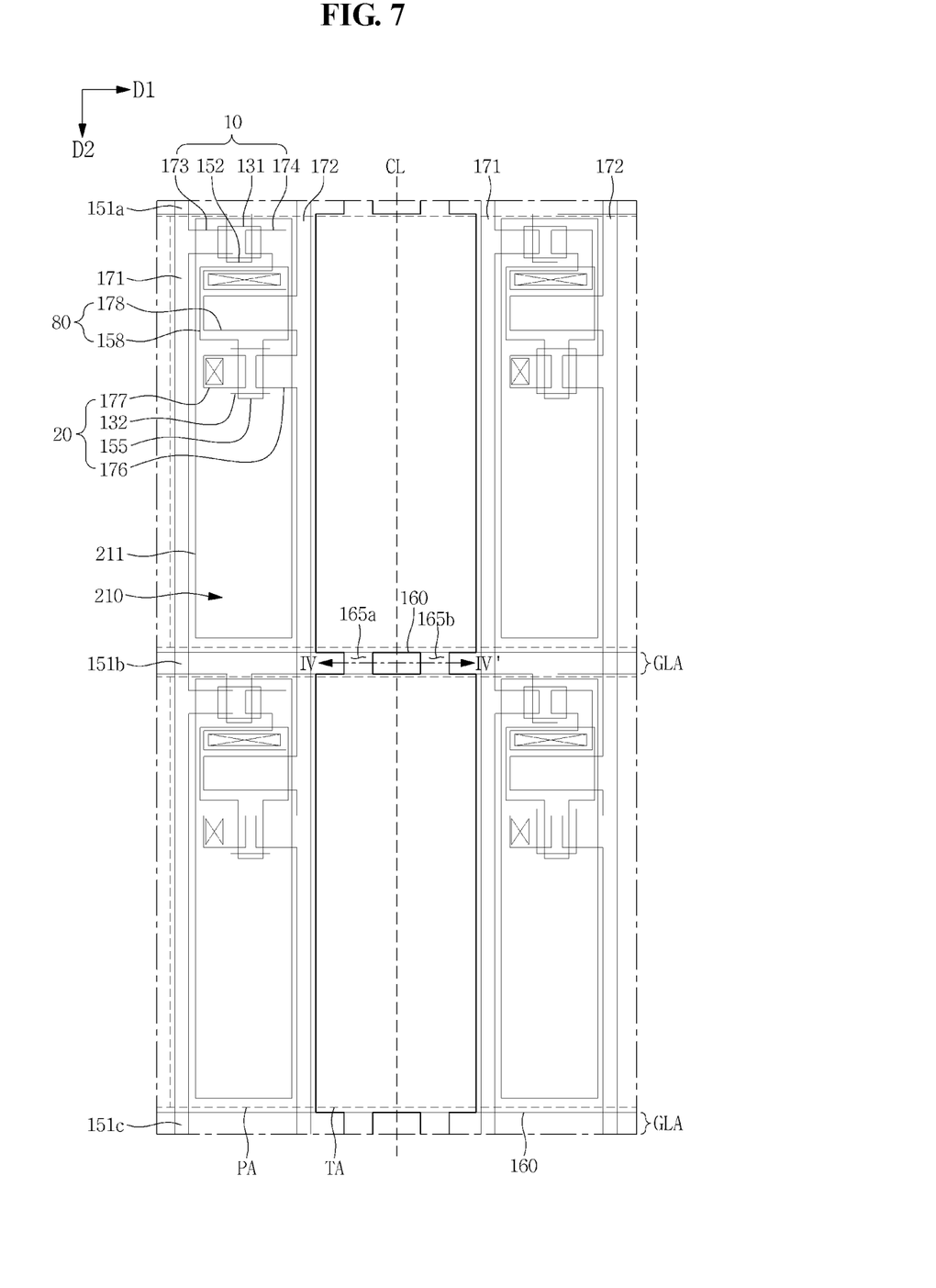
FIG. 7 is an enlarged top plan view illustrating another exemplary embodiment of a portion of a transparent display panel of a transparent display device according to the invention.
Figure 8:
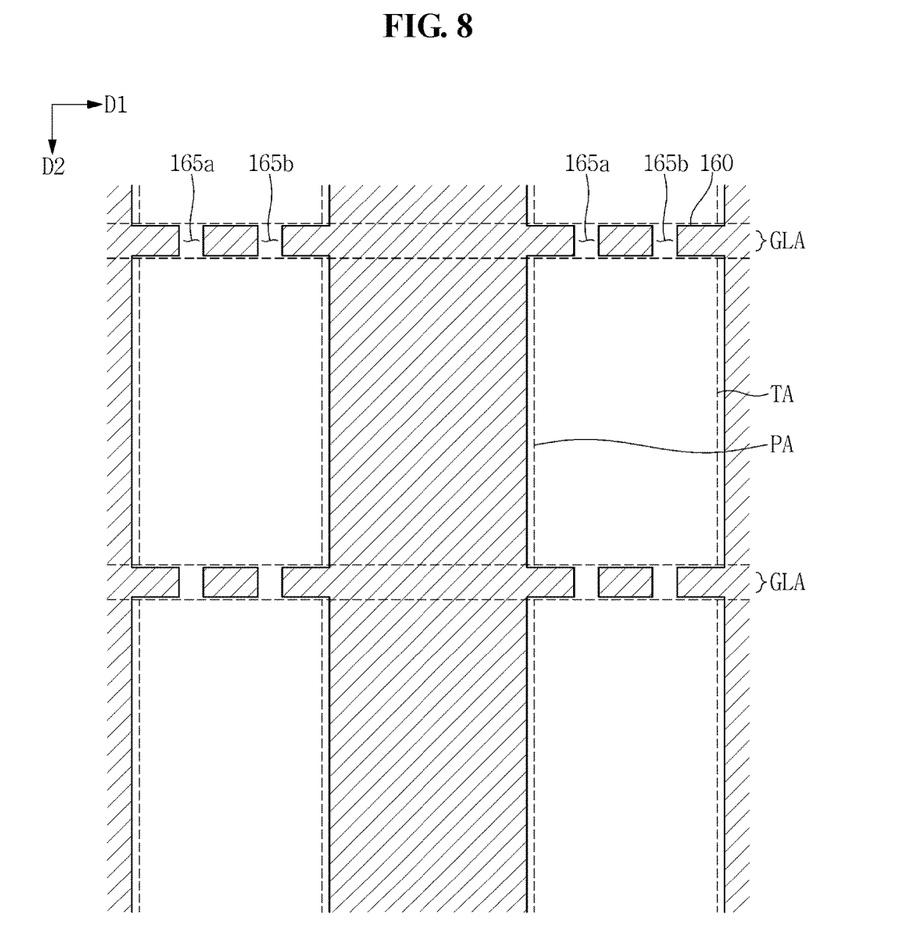
FIG. 8 is a top plan view illustrating another exemplary embodiment of a portion of an insulating layer of a transparent display panel according to the invention.
Figure 9:
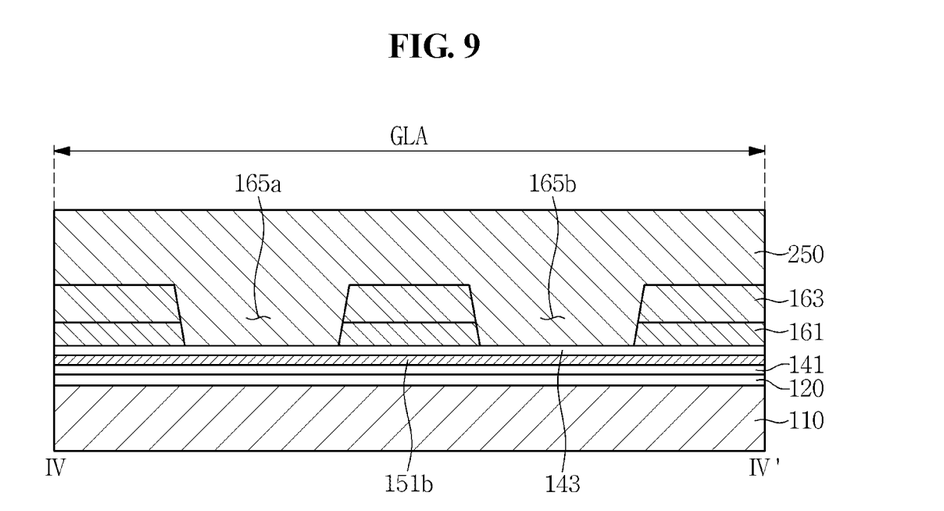
FIG. 9 is a cross-sectional view of the transparent display panel taken along line IV-IV' of FIG. 7.

FIG. 7 is an enlarged top plan view illustrating another exemplary embodiment of a portion of a transparent display panel according to the invention, FIG. 8 is a top plan view illustrating another exemplary embodiment of a portion of an insulating layer according to the invention, and FIG. 9 is a cross-sectional view of the transparent display panel taken along line IV-IV' in FIG. 7.

The repeated descriptions of the transparent display device according to an exemplary embodiment will be omitted from the descriptions of the transparent display device according to an alternative exemplary embodiment.

Referring to FIG. 8, an insulating layer pattern 160 is at a pixel area PA and a gate line area GLA. At the gate line area, portions of the insulating layer pattern 160 may define two grooves 165a and 165b between adjacent transmission areas TA. However, exemplary embodiments are not limited thereto, and the insulating layer pattern 160 may have three or more grooves at a boundary between adjacent transmission areas TA to smooth the flow of liquid therebetween.

The insulating layer pattern 160 is disconnected at the gate line area GLA by each of the grooves 165a and 165b. That is, the insulating layer pattern 160 is broken at the gate line area GLA by each of the grooves 165a and 165b to dispose portions of the insulating layer pattern 160 at opposing sides of the groove 165a and 165b in the first direction D1. Accordingly, the plurality of grooves 165a and 165b fluidly connect the adjacent transmission areas TA to each other to allow a liquid such as an etchant or a cleaning solution used in the manufacturing process of the transparent display device to flow into the adjacent transmission areas TA along the second direction D2. Accordingly, display defects that may occur due to stagnation of the liquid such as an etchant and a cleaning solution may be substantially reduced or effectively prevented.

According to an exemplary embodiment, a sealing member 250 may contact a second gate insulating layer 143 exposed at each of the grooves 165a and 165b. Although not illustrated in the drawing, in the case where the second gate insulating layer 143 is omitted, the sealing member 250 may contact a first gate insulating layer 141 and a gate line 151b exposed at each of the grooves 165a and 165b.

According to an exemplary embodiment, the two grooves 165a and 165b are symmetric with respect to a central line CL of transmission areas TA adjacent to each other in the second direction D2. Accordingly, the aforementioned liquid may flow uniformly, such that display defects that may occur due to stagnation of the liquid may be substantially reduced or effectively prevented.

As set forth above, in the transparent display device according to one or more exemplary embodiments, a visible spot that may occur at the transmission area may be reduced or effectively prevented.

It is possible to reduce or effectively prevent display unevenness that may occur at the transmission area.

While the invention has been illustrated and described with reference to the exemplary embodiments thereof, it will be apparent to those of ordinary skill in the art that various changes in form and detail may be made thereto without departing from the spirit and scope of the invention.

What is claimed is:

1. A transparent display device comprising:
a display panel which displays an image with light, the display panel comprising:
a substrate comprising: a pixel area at which light is generated, a transmission area at which light transmits through the display panel, and a gate line area in which a gate line is disposed;
at the pixel area, a display element which generates the light at the pixel area, and a driving circuit which drives the display element to generate the light at the pixel area; and
an insulating layer pattern at the pixel area and the gate line area, defining:
the transmission area of the substrate, and
a groove overlapping the gate line, the groove connected to the transmission area.

2. The transparent display device as claimed in claim 1, wherein portions of the insulating layer pattern at the gate line area are disconnected from each other at the transmission area by the groove.

3. The transparent display device as claimed in claim 2, wherein the driving circuit further comprises a second gate insulating layer on the first gate insulating layer.

4. The transparent display device as claimed in claim 3, wherein the insulating layer pattern comprises a first insulating layer and a second insulating layer.

5. The transparent display device as claimed in claim 4, wherein at the pixel area, the first insulating layer is between the second gate insulating layer and the second insulating layer.

6. The transparent display device as claimed in claim 5, wherein at the pixel area, the second insulating layer is between the first insulating layer and the common electrode.

7. The transparent display device as claimed in claim 3, further comprising a sealing member on the display panel, the sealing member commonly disposed in the pixel area, the transmission area and the gate line area of the substrate.

8. The transparent display device as claimed in claim 7, wherein the sealing member contacts the second gate insulating layer at the groove of the insulating layer pattern.

9. The transparent display device as claimed in claim 8, wherein the sealing member contacts the second gate insulating layer at the transmission area.

10. The transparent display device as claimed in claim 2, wherein for the display panel including the substrate, the display element, the driving element and the insulating layer pattern, a total thickness of the display panel at the transmission area is less than a total thickness of the display panel at the pixel area.

11. The transparent display device as claimed in claim 2, wherein in a top plan view, the transmission area has a larger total area than a total area of the pixel area.

12. The transparent display device as claimed in claim 2, wherein in a top plan view, the groove has one of a triangular shape, a quadrangular shape or a polygonal shape.

13. The transparent display device as claimed in claim 2, wherein in a top plan view, the groove is symmetric with respect to a central line of the transmission area.

14. The transparent display device as claimed in claim 1, wherein the display element comprises a pixel electrode, a light emitting layer and a common electrode, and the light emitting layer is disposed between the transmission areas along a first direction, and between the gate line areas along a second direction on the plan view in the pixel area.

15. A transparent display device comprising:
a display panel which displays an image with light, the display panel comprising:
a substrate comprising:
a pixel area at which light is generated, comprising a display element which generates the light at the pixel area, and a driving circuit which drives the display element to generate the light at the pixel area;
a gate line area in which a gate line is disposed; and
a transmission area at which light transmits through the display panel, the transmission area provided in plural to dispose the gate line area between adjacent transmission areas, and
an insulating layer pattern at the pixel area and the gate line area, the insulating layer pattern at the pixel area extending from the pixel area to be disposed at the gate line area between the adjacent transmission areas,
wherein the insulating pattern defines:
the transmission areas of the substrate, and
a groove at the gate line area between the transmission areas, the groove connecting the transmission areas to each other.

16. The transparent display device as claimed in claim 15, wherein at the pixel area,
the driving circuit comprises a gate electrode, a source electrode, a drain electrode, and a gate insulating layer between the gate electrode and each of the source and drain electrodes,
the display element comprises a pixel electrode, a light emitting layer and a common electrode, and
the insulating layer pattern is between the gate insulating layer and the common electrode.

17. The transparent display device as claimed in claim 16, wherein the gate insulating layer of the pixel area extends from the pixel area to be disposed in the gate line area,
further comprising a sealing member on the display panel, the sealing member commonly disposed in the pixel area, the transmission area and the gate line area of the substrate to contact the gate insulating layer at the groove in the gate line area.

18. The transparent display device as claimed in claim 15, wherein the insulating layer pattern disposed at the gate line area between the adjacent transmission areas defines a plurality of grooves in the insulating layer pattern, the plurality of grooves connecting the adjacent transmission areas to each other.

19. The transparent display device as claimed in claim 15, wherein for the display panel including the substrate, the display element, the driving element and the insulating layer pattern, a total thickness of the display panel at the transmission area is less than a total thickness of the display panel at the pixel area.

20. A method of forming a transparent display panel, comprising:
providing a substrate comprising: a pixel area at which light is generated, a plurality of transmission areas at which light transmits through the transparent display panel, and a gate line area in which a gate line is disposed between adjacent transmission areas;

providing at the pixel area, a display element which generates the light at the pixel area, and a driving circuit which drives the display element to generate the light at the pixel area; and providing an insulating layer pattern at the pixel area to be disposed between the display element and the driving circuit and at the gate line area to overlap the gate line disposed between the adjacent transmission areas, wherein the providing the insulating layer pattern:
  defines the transmission areas of the substrate, and
  defines a groove in the insulating layer pattern, at the gate line area, to connect the transmission areas to each other.

* * * * *